United States Patent [19]

Reichert

[11] Patent Number: 4,863,556
[45] Date of Patent: Sep. 5, 1989

[54] METHOD FOR TRANSFERRING SUPERFINE PHOTORESIST STRUCTURES

[75] Inventor: Hansjörg Reichert, Munich, Fed. Rep. of Germany

[73] Assignee: Siemens Aktiengesellschaft, Berlin and Munich, Fed. Rep. of Germany

[21] Appl. No.: 196,755

[22] Filed: May 18, 1988

Related U.S. Application Data

[63] Continuation of Ser. No. 901,391, Aug. 28, 1986, abandoned.

[30] Foreign Application Priority Data

Sep. 30, 1985 [DE] Fed. Rep. of Germany ....... 3534834

[51] Int. Cl.⁴ .......................................... H01L 21/308
[52] U.S. Cl. ...................................... 156/628; 156/643; 156/657; 156/659.1; 156/661.1; 437/228; 437/240; 437/241
[58] Field of Search ............. 156/628, 643, 657, 659.1, 156/661.1; 437/228, 238–241, 931, 978

[56] References Cited

U.S. PATENT DOCUMENTS

| 4,450,041 | 5/1984 | Aklufi ................................ | 156/628 |
| 4,514,251 | 4/1985 | Van Ommen et al. ............. | 156/628 |

FOREIGN PATENT DOCUMENTS

| 53-119686 | 10/1978 | Japan | 156/659.1 |
| 55-157234 | 12/1980 | Japan | 156/643 |
| 56-76536 | 6/1981 | Japan | 156/628 |
| 58-131 | 1/1983 | Japan | 156/628 |
| 58-98932 | 6/1983 | Japan | 156/628 |
| 59-227124 | 12/1984 | Japan | 156/628 |

OTHER PUBLICATIONS

Journal of Electrochemical Society, vol. 128, No. 3, Mar. 1981, pp. 617–619.
IEEE Transactions on Electron Devices, vol. ED-26, No. 4, Apr. 1979, pp. 604–610.
IBM Technical Disclosure Bulletin, vol. 24, No. 11B, Apr. 1982, p. 634.
IBM Technical Disclosure Bulletin, vol. 17, No. 2, Jul. 1974, p. 635.

*Primary Examiner*—Kenneth M. Schor
*Assistant Examiner*—Andrew J. Anderson

[57] ABSTRACT

A geometrically accurate transfer with low manufacturing tolerances is made possible by a method for transferring superfine photoresist structures into a dielectric layer. A photoresist mask is provided on the dielectric layer. This mask is used in a subsequent ion implantation. The implantation is carried out under such circumstances that neither the resist mask nor the dielectric layer which is to be structured is got through by the incident ion beam.

4 Claims, 1 Drawing Sheet

$R = \tan \alpha \times D$

METHOD FOR TRANSFERRING SUPERFINE PHOTORESIST STRUCTURES

This is a continuation of application Ser. No. 901,391 filed Aug. 28, 1986, now abandoned.

BACKGROUND OF THE INVENTION

1. Field of the Invention

The present invention relates to a method for transferring superfine photoresist structures into a dielectric layer by means of selective ion bombardment.

2Description of the Prior Art

In the manufacture of semiconductor components, fine structures having minute structural dimensions and tolerances on the order of magnitude of 0.1 micron must be generated in a dielectric layer. For this purpose, a photoresist mask is usually applied to the dielectric layer to be structured. The structures of the photoresist mask are then transferred geometrically in precise form to the dielectric layer to be structured. Frequently, an oxide layer and/or a nitride layer are employed as the dielectric layer to be structured.

In previous methods for transferring superfine photoresist structures into a dielectric layer, the geometric precision of the structure transferred onto the etched, dielectric layer was unfavorably influenced because of a poor adhesion of the photoresist to the dielectric layer. In the known methods for transferring superfine photoresist structures into a dielectric layer, the width of the lateral undercutting was equal to the thickness of the etched dielectric layer even with ideal adhesion of the photoresist to the dielectric layer.

In previous methods for transferring superfine structures, the narrowest possible strips in the photoresist structure were imaged onto the dielectric layer to be structured. In these known methods for transferring superfine photoresist structures, however, these very narrow strips were still too wide for microwave transistors. As a result of heating the photoresist mask at temperatures of 100° C. to 140° C., the strip width to be imaged onto the dielectric layer to be structured becomes smaller in the structure of the photoresist mask in that the edge regions of the photoresist mask run together. This procedure of converging the edge regions of the photoresist mask must be terminated at the desired strip width in the structure of the photoresist mask. The speed at which the lacquer bleeds, however, cannot be predetermined. Repeated interruptions with optical control of the strip widths in the structure of the photoresist masks on the semiconductor wafers are therefore necessary during the bleeding of the lacquer. When the desired strip width in the structure of the photoresist mask is not achieved during the lacquer bleeding, the photo technique in which the photoresist mask is structured must be repeated.

The lacquer bleeding for diminishing the strip width in the structure of the photoresist mask on a semiconductor wafer does not occur with three-dimensional uniformity. Great manufacturing tolerances must therefore be accepted in the manufacture of solenoid conductor components with the employment of known methods for transferring superfine photoresist structures.

SUMMARY OF THE INVENTION

The present invention provides a method of the type described in which a geometrically accurate transfer of superfine photoresist structures into a dielectric layer is made possible with small manufacturing tolerances.

In accordance with the present invention, there is provided a method wherein an apertured photoresist mask is generated on a dielectric layer, and an ion beam is directed through the apertures in the mask under conditions such that neither the photoresist mask nor the dielectric layer to be structured are penetrated by the incident ion beam.

The method of the invention possesses the following advantages:

1. A poor photoresist adhesion on the dielectric layer to be structured which has an unfavorable influence on the geometric trueness of the etched dielectric layer in conventional methods is avoided.

2. The lateral undercutting which is at least equal to the thickness of the etched layer in a conventional method even with ideal lacquer adhesion on the dielectric layer to be structured can be reduced considerably.

3. The implantation with an ion beam at an oblique angle to impinge a semiconductor wafer leads to a shadowing with a suitable orientation of the resist edge relative to the ion beam. The strip width in the dielectric layer to be structured thereby ends up narrower than the strip width of the photoresist structure imaged onto the dielectric layer to be structured in the shadow imaging.

These advantages enable the conventional photo technique to still be utilized in the manufacture of microwave transistors wherein strip widths in the submicron range are required. Strip widths on a dielectric layer to be structured which already are below the barely imagable strip width in the structure of the photoresist masks can still be reliably produced with the method of the present invention.

BRIEF DESCRIPTION OF THE DRAWINGS

Further advantages and features of the present invention are shown in the drawings, in which.

DESCRIPTION OF THE PREFERRED EMBODIMENTS

In accordance with the present invention, there is provided a resist mask 1 as in conventional etching technology. This apertured mask 1 serves to mask a subsequent ion implantation. The ion implantation is controlled such that neither the resist mask 1 nor the underlying dielectric layers to be structured are got through by the incident ion beam. The transmission intensity of the ion beam impinging upon the resist mask 1 and upon the respective dielectric layers to be structured should be less than $10^{-5}$. Neither a doping of the underlying semiconductor crystal 7 nor a doping of the dielectric layers located above the semiconductor crystal occurs insofar as the dielectric layer to be structured is located under the resist 1.

There are numerous possibilities of designing the method depending upon the dielectric layer to be processed.

Figure 1:
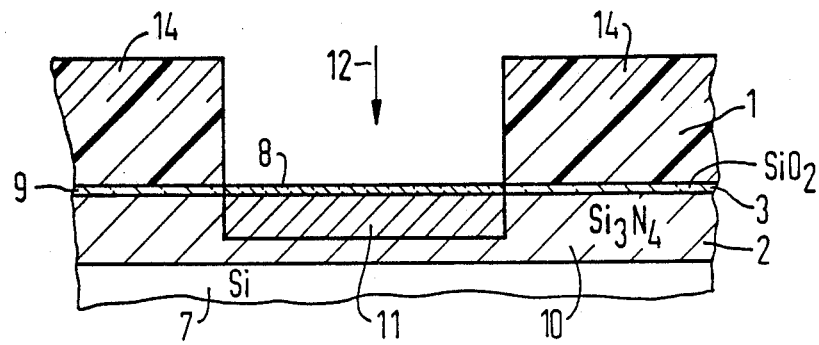
FIG. 1 illustrates the structuring of a silicon nitride layer with a thin oxide layer.

In FIG. 1 there is shown the structuring of a silicon nitride layer 2 with a superficial thin oxide layer 3. The nitride layer 2 can be superficially converted into a silicon dioxide layer 3 by means of thermal oxidation. The thickness of the oxide layer usually is between 2 nm and 5 nm. The oxide layer 3 prevents an etching attack of the nitride layer 2 which lies therebelow in hot phosphoric acid which is the standard etchant for silicon nitride.

In the resist-free regions, the oxide 8 is chemically changed or damaged by the ion beam 12 due to the implantation such that the oxide layer 8 becomes easily etchable in hot phosphoric acid. After the implantation of the oxide 8, the photoresist mask 1 is rendered superfluous. The photoresist mask 1 can then be stripped off before the phosphoric acid etching without damage. The damaged oxide 8 is selectively etched in the phosphoric acid. The undamaged region 9 of the oxide is not attacked by the phosphoric acid and remains in place. Advantageously, the nitride in the implanted region is likewise damaged by the ion beam 12 and is thereby significantly more quickly etchable than the undamaged nitride 10 located outside of the resist-free region. As a result of this selective etching and anisotropy between the damaged nitride layer 11 and the undamaged nitride layer 10, shorter etching times are required overall than are required in normal methods. In the normal method, the nitride 11 would not be damaged by an implantation and, consequently, would not be more quickly etchable than the undamaged nitride 10. In trials, the overall etching time could be cut in half in comparison to the etching time of identical layer thickness by the conventional technique. The undesired lateral sub-surface etching in the region of the nitride layer 2 is likewise correspondingly halved.

Figure 2:
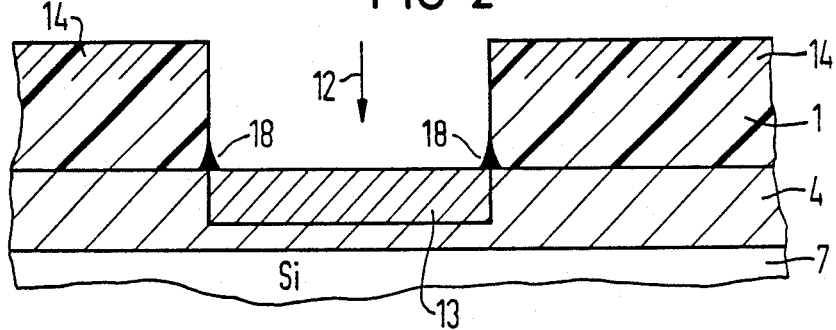
FIG. 2 illustrates the structuring of a pure oxide or nitride layer.

FIG. 2 illustrates the structuring of a pure oxide or a pure nitride layer 4. A result analogous to the method set forth with respect to FIG. 1 can also be achieved using a pure oxide or nitride layer 4 without a thin cover layer having to be applied or generated and then being rendered selectively etchable by implantation. Due to implantation, the photoresist 1 is, so to speak, welded to the dielectric layer 4 at the edge of the resist 18. The dielectric 4 in the implanted region 13 is likewise more easily etchable than in the non-implanted region. As a result of this etching and anisotropy, the undercutting within the layer can be reduced in the same way analogous to the method set forth with reference to FIG. 1. As a consequence of the ion implantation, the region 13 of the silicon dioxide or silicon nitride layer has again been damaged and, as a result, is considerably more etchable in comparison to the region of the layer 4 which has not been damaged by ion implantation.

It may be seen in all the exemplary embodiments that the photoresist layer 1 is likewise doped in the upper region 14 as a result of the ion implantation.

Figure 3:
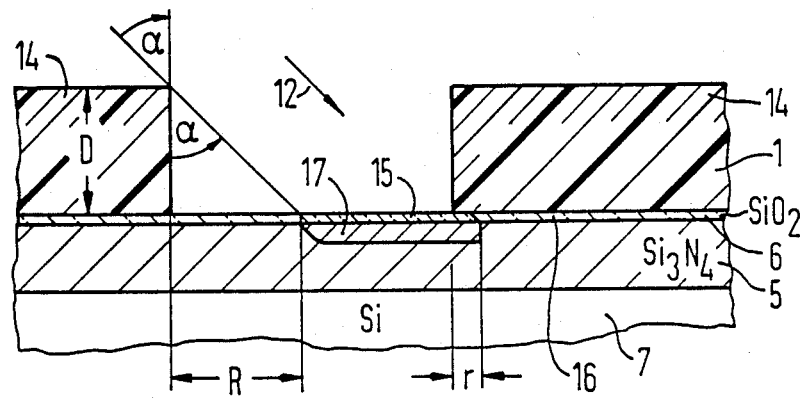
FIG. 3 illustrates the structuring of a dielectric layer using the shadowing at a resist edge for further reduction of the structure width.

FIG. 3 illustrates the structuring of a dielectric layer using the shadowing at a resist edge for further reduction of the strip width. The photoresist mask 1 consists of a thickness D and the ion beam 12 is inclined by the angle α with respect to the perpendicular on the dielectric layer. With an obliquely incident ion beam 12, a further reduction of the strip width by an amount R is obtained in accordance with FIG. 3, since:

$R = D \cdot \tan\alpha$

The theoretical value R for the reduction of the strip width by casting a shadow is not entirely achieved due to the under-implantation at the opposing edge. Ions also penetrate into the resist 1 at the opposite edge and within a region r can be partially penetrated through the photoresist layer 1 into the dielectric layers 5, 6, lying beneath the photoresist layer 1. The dielectric layers 5, 6 are damaged in the regions 15, 17 by the obliquely incident ion beam 12 and become considerably more easily etchable than the undamaged region of the dielectric layers 5, 6.

The obliquely incident ion beam can serve to structure a nitride layer 5 with a thin oxide layer 6 as set forth with reference to FIG. 1 or it may serve to structure a pure oxide or pure nitride layer as set forth with reference to FIG. 2. Other dielectrics can also be structured with the method of the invention. For example, other oxides or nitrides and other dielectrics such, for example, as sulfides, fluorides and others can be structured with the method of the present invention.

When, as described in FIG. 1, a thin oxide layer is intended to protect a nitride layer against phosphoric acid etching in the non-damaged region, due to under-implantation in the region r in FIG. 3, it is advantageous to not remove the resist mask before the etching with hot phosphoric acid, since the anticipated undercutting in the region r can be spatially limited in this way.

It should be evident that various modifications can be made to the described embodiments without departing from the scope of the present invention.

I claim as my invention:

1. A method for forming patterns in the sub-micron range in a silicon nitride layer to be structured on a substrate comprising:
   thermally generating a thin superficial silicon oxide layer over said nitride layer;
   generating a photoresist mask with patterns in the sub-micron range directly over the thermally generated silicon oxide layer;
   directing an ion beam towards said substrate, said beam impinging and thereby damaging and chemically modifying at least portions of said thermally generated silicon oxide layer exposed by said photoresist mask so as to make said portions readily etchable in phosphoric acid, while neither the photoresist nor the nitride layer to be structured is completely penetrated through by the ion beam;
   selectively etching the damaged portions of the silicon oxide layer with respect to remaining non-damaged portions in phosphoric acid; and
   subsequently etching the silicon nitride layer in phosphoric acid to form patterns in the sub-micron range corresponding to the photoresist mask patterns using the remaining non-damaged portions of the silicon oxide layer as a mask.

2. A method according to claim 1 wherein the ion beam is of an intensity sufficient to also chemically modify the region of said nitride layer beneath said damaged portions of said oxide layer.

3. A method according to claim 1 wherein said ion beam is directed at an oblique angle to the portions of the oxide layer which are impinged by said ion beam.

4. A method according to claim 3 which further includes the step of removing said photoresist mask after etching the nitride layer to be structured.

* * * * *